United States Patent
Takeuchi et al.

[11] Patent Number: 5,935,337
[45] Date of Patent: Aug. 10, 1999

[54] THIN-FILM VAPOR DEPOSITION APPARATUS

[75] Inventors: Noriyuki Takeuchi, Hadano; Takeshi Murakami, Tokyo; Hiroyuki Shinozaki; Kiwamu Tsukamoto, both of Fujisawa; Masaru Nakaniwa, Ebina; Naoki Matsuda, Yokohama, all of Japan

[73] Assignee: Ebara Corporation, Tokyo, Japan

[21] Appl. No.: 08/634,847

[22] Filed: Apr. 19, 1996

[30] Foreign Application Priority Data

Apr. 20, 1995 [JP] Japan ................................ 7-119259
Apr. 20, 1995 [JP] Japan ................................ 7-119260

[51] Int. Cl.⁶ .................................................. C23C 16/00
[52] U.S. Cl. .......................................... 118/724; 118/715
[58] Field of Search ..................................... 118/724, 715

[56] References Cited

U.S. PATENT DOCUMENTS

| | | | |
|---|---|---|---|
| 4,209,357 | 6/1980 | Gorin | 156/643 |
| 4,625,678 | 12/1986 | Shioya | 118/724 |
| 5,106,453 | 4/1992 | Benko et al. | |
| 5,653,806 | 8/1997 | Van Buskirk | 118/724 |

FOREIGN PATENT DOCUMENTS

| | | |
|---|---|---|
| 63-307276 | 12/1988 | Japan . |
| 5-335248 | 12/1993 | Japan . |
| 6-65751 | 8/1994 | Japan . |
| 93 257724 | 12/1993 | WIPO . |
| 96 28585 | 9/1996 | WIPO . |

OTHER PUBLICATIONS

Chinoy et al., "A Novel Reactor for Large–Area Epitaxial Solar Cell Materials", vol. 30, No. 1, pp. 323–335, May 1, 1991.

Primary Examiner—Richard Bueker
Attorney, Agent, or Firm—Wenderoth, Lind & Ponack, L.L.P.

[57] ABSTRACT

A thin-film vapor deposition apparatus has a reaction casing defining a reaction chamber, a stage for supporting a substrate, the stage being disposed in the reaction chamber, and a shower head supported on the reaction casing in confronting relation to the stage for discharging a material gas toward the substrate on the stage for depositing a thin film on the substrate. A plurality of flow path systems are disposed in various regions of the shower head and the reaction casing for passage therethrough a heating medium to control the temperatures of the regions under the control of a temperature controller.

49 Claims, 8 Drawing Sheets

THIN-FILM VAPOR DEPOSITION APPARATUS

BACKGROUND OF THE INVENTION

1. Field of the Invention

The present invention relates to a thin-film vapor deposition apparatus, and more particularly to a thin-film vapor deposition apparatus suitable for depositing in a vapor or gas phase a thin film, having a high dielectric constant, of barium titanate, strontium titanate, or the like.

2. Description of the Prior Art

Recent years have shown a need for ever-increasing levels of integration of semiconductor integrated circuits produced by semiconductor manufacturers. Research and development activities are switching from efforts to manufacture present DRAMs (dynamic random-access memories) having a storage capacity of megabits toward attempts to produce future DRAMs having a storage capacity of gigabits. Such DRAMs contain capacitive elements which should preferably provide as large a capacity as possible while taking up as small an area as possible. One dielectric thin film which is presently used in the art to provide such a capacitive element comprises a film of silicon oxide or a film of silicon nitride. These films have a dielectric constant of 10 or smaller. Among promising thin-film materials proposed for use in the future are metal oxides including tantalum pentoxide ($Ta_2O_5$) having a dielectric constant of about 20, barium titanate ($BaTiO_3$) having a dielectric constant of about 300, strontium titanate ($SrTiO_3$), or a mixture thereof, i.e., barium strontium titanate.

One conventional vapor deposition apparatus for fabricating such a thin film of metal oxide is disclosed in Japanese laid-open patent publication No. 63-307276, for example. Such disclosed vapor deposition apparatus includes a reaction tube for accommodating a substrate that is kept in a heated condition. A gas composed of a plurality of organic metal compounds is introduced into the reaction tube to deposit a metal compound generated in a vapor-phase reaction onto the heated substrate. The disclosed vapor deposition apparatus has a heating device for heating the wall surface of a gas supply system for introducing the gas composed of organic metal compounds, a heating device for heating the reaction tube, a supply device for supplying a gas containing oxygen, an inlet tube for introducing the gas containing oxygen closely to the substrate, and an inlet tube for introducing the gas from the gas supply system into the reaction tube.

Generally, the gas composed of organic metal compounds is highly unstable in oxygen. Therefore, if oxygen were introduced into the reaction system, it would tend to cause an explosion or develop a premature reaction in regions other than the substrate. To avoid such an explosion or a premature reaction, both the inlet tubes extend separately to a position near the substrate to introduce and mix the oxygen-containing gas and the organic metal compound gas quickly and uniformly with each other closely to the substrate for thereby growing a thin film of metal oxide on the substrate. Since the organic metal compound gas is in a liquid phase at normal temperature, the inlet tube for introducing the organic metal compound gas and the entire reaction system have to be heated by the heating devices to prevent the organic metal compound gas from being condensed. The substrate is placed on a susceptor which is associated with a heater for heating the susceptor to and keeping it at a temperature suitable for a reaction for vapor-phase deposition.

Japanese laid-open patent publication No. 5-335248 shows a thin-film vapor deposition apparatus having a heater for heating a semiconductor substrate placed in a reaction casing to effect vapor-phase deposition on the semiconductor substrate, and another heater for heating the inner wall of an inlet tube, which introduces a material gas into the reaction casing, so that the material gas will not be condensed in the inlet tube.

Japanese laid-open patent publication No. 4-364024 shows a thin-film vapor deposition method which uses an organic metal compound gas as a material gas. The disclosed method is aimed at the fabrication of an epitaxial growth layer of uniform thickness with good reproducibility from such an organic metal compound gas. Specifically, during the vapor-phase deposition process, the organic metal compound gas flows around a baffle plate disposed parallel to a substrate on which to deposit a thin film, and is delivered radially inwardly along a gas ejector disk through radial slots defined therein whose widths are not equal to each other. The gas flow delivered radially inwardly along the gas ejector disk is supplied onto the substrate which is being heated and rotated for thereby compensating for irregularities of the deposition rate. As a result, an epitaxial growth layer of uniform thickness can be produced with good reproducibility on the substrate.

For depositing a thin film of a metal oxide such as barium titanate or the like in a vapor phase, it is necessary that the reaction casing and the substrate be kept at totally different temperatures. For example, the reaction casing should be kept at a temperature ranging from 250° C. to 260° C., which is a lower limit temperature to prevent the thin-film material from being condensed and an upper limit temperature to keep the thin-film material gas in a vapor gas without being decomposed, with a temperature accuracy of ±2%, and the substrate should be kept at a temperature ranging from 400° C. to 700° C. with a temperature accuracy of ±1%. The thin-film vapor deposition apparatuses disclosed in the above publications fail to control the temperatures of the reaction casing and the substrate independently of each other. The heating device for heating the reaction tube typically comprises an electric oven or a high-temperature ribbon heater. Consequently, it is difficult to keep the inner wall of the reaction casing at a desired temperature in a region where the material gas is introduced, on account of the radiant heat applied from the heating device for heating the substrate.

A shower head for discharging a material gas to grow a thin film on a substrate is required to eject a flow of the material gas, which has been uniformly heated to a high constant temperature, with a uniform density across the entire surface of the shower head.

With the thin-film vapor deposition apparatus disclosed in the above publications, it is difficult to eject a flow of the uniformly heated high-temperature material gas with a uniform density across the entire surface of the shower head. For example, a thin-film vapor deposition apparatus disclosed in Japanese laid-open patent publication No. 4-364024 has a high-frequency coil for heating a susceptor from around a reaction casing, and a gas inlet manifold such as a gas ejector disk which is heated by radiant heat produced by the high-frequency coil. Since the material gas is ejected from the slots defined in the gas inlet manifold and having widths which are not equal to each other, it is difficult to supply a flow of the uniformly heated high-temperature material gas with a uniform density to the substrate.

SUMMARY OF THE INVENTION

It is therefore an object of the present invention to provide a thin-film vapor deposition apparatus which is capable of maintaining a substrate at a predetermined temperature in a reaction casing upon vapor deposition of a thin film on the substrate, and of accurately controlling temperatures in various regions around the reaction casing.

According to an aspect of the present invention, there is provided a thin-film vapor deposition apparatus comprising a reaction casing defining a reaction chamber, a stage for supporting a substrate, the stage being disposed in the reaction chamber, a shower head for discharging a material gas toward the substrate on the stage for depositing a thin film on the substrate, and a plurality of temperature control means disposed in regions of the shower head and the reaction casing, for controlling temperatures of the regions, at least one of the temperature control means being arranged to pass a heating medium therethrough. The temperature control means thus arranged make it possible to adjust the temperatures of inner walls of the regions which surround the reaction chamber as desired. For example, the substrate on which the thin film is to be deposited is heated to 550° C. by a heater unit in the stage, and when the stage, if vertically movable, is lifted or lowered in the reaction chamber, the temperatures in the reaction chamber changes. Since the temperatures of the inner walls of the regions which surround the reaction chamber can be adjusted, however, the temperature in the reaction chamber can be kept at a constant temperature of 250° C., for example, with a temperature accuracy of ±2%. Particularly, the shower head, which is directly affected by the heat of the stage as it is vertically moved, can be maintained at a constant temperature by one of the temperature control means which may be associated with the shower head. Consequently, nozzles of the shower head are prevented from being clogged with the material gas which would otherwise be condensed or a reactive product which would otherwise be generated, making it possible to deposit a high-quality thin film of metal oxide on the substrate.

The at least one of the temperature control means may comprise detecting means for detecting a temperature of an inner wall of the reaction chamber, and flow rate regulating means for regulating a rate of flow of the heating medium depending on a difference between the temperature detected by the detecting means and a target temperature. Alternatively, the at least one of the temperature control means may comprise detecting means for detecting a temperature of an inner wall of the reaction chamber, and temperature adjusting means for adjusting a temperature of the heating medium depending on a difference between the temperature detected by the detecting means and a target temperature. Since rate of flow or the temperature of the heating medium can be regulated, depending on the difference between the temperature detected by the detecting means and the target temperature, the amount of thermal energy applied by the heating medium can be controlled. Therefore, the inner wall temperature of the reaction chamber can be maintained at a predetermined temperature.

At least one of the temperature control means may further comprise a flow path system for passing the heating medium therethrough, and cooling means disposed in the flow path system for cooling the heating medium to a temperature lower than the temperatures of regions controlled by other temperature control means. Even when the stage heated to a high temperature is lifted close to the shower head, the temperature of the shower head can be kept at a constant temperature because the shower head may be supplied with the heating medium at a relatively low temperature.

The at least one of the temperature control means may comprise a flow path system for passing the heating medium therethrough, the flow path system comprising a plurality of substantially circular concentric flow paths lying in substantially horizontal planes, respectively, and each extending along a partial circumferential length shorter than a full circumferential length. The reaction casing or other components which incorporate such a flow path system can be machined with ease and manufactured relatively inexpensively, and can be controlled uniformly at a predetermined temperature.

The reaction casing may comprise an inner wall, an outer wall, a plurality of ribs projecting from the inner wall and held against the outer wall, and flow paths for passing the heating medium therethrough being defined by the ribs between the inner wall and the outer wall. Inasmuch as the ribs are integral with the inner wall, they have a high efficiency of heat transfer for supplying thermal energy carried by the heating medium efficiently to the inner wall of the reaction chamber.

The at least one of the temperature control means may comprise flow path systems for passing the heating medium therethrough, at least one of the flow path systems being disposed in each of the shower head and the reaction casing. This arrangement makes it possible to control, with ease, the temperature to the shower head which requires highly accurate temperature control.

The shower head may comprise a vertical cylindrical portion and a nozzle portion, each of the vertical cylindrical portion and the nozzle portion having at least one of the flow path systems. The reaction casing may comprise a casing member of an inverted pot shape connected to the shower head and a support base disposed near the stage and spaced from the stage, each of the casing member and the support base having at least one of the flow path systems. Since the shower head and the reaction casing have a plurality of flow path systems, the temperatures of the various regions surrounding the reaction chamber can be controlled uniformly as required.

The reaction casing may further comprise a shield plate disposed between the stage and the support base. The shield plate is effective in blocking radiant heat from the stage which is heated to a high temperature, allowing the temperature of the reaction casing to be controlled easily.

The heating medium may comprise a fluorine-base liquid-phase fluid. The fluorine-base liquid-phase fluid has good heat transfer characteristics for a stable heat exchange.

The thin film may comprise a thin film of metal oxide, and the material gas may comprise an organic metal gas and an oxygen-containing gas. Accordingly, a thin film of strontium oxide or barium oxide, for example, having a very high dielectric constant may be deposited on the substrate.

According to another aspect of the present invention, there is provided a method of depositing a thin film on a substrate by discharging a material gas toward the substrate which is heated in a reaction chamber, comprising the steps of passing a heating medium in at least one of a plurality of temperature control means disposed in regions of a shower head and a reaction casing which surround the reaction chamber, and regulating a rate of flow and/or a temperature of the heating medium flowing through the at least one of the temperature control means to control temperatures of inner wall portions which surround the reaction chamber while the thin film is being deposited on the substrate. According to this method, it is possible to deposit the thin film on the substrate while keeping the temperatures of inner wall portions which surround the reaction chamber at predetermined temperatures with the temperature control means.

Therefore, the material gas, which is highly sensitive to temperatures, can be introduced at a controlled temperature into the reaction chamber for depositing a high-quality thin film on the substrate.

According to still another aspect of the present invention, there is provided a thin-film vapor deposition apparatus comprising a reaction casing defining a reaction chamber, a stage for supporting a substrate, the stage being disposed in the reaction chamber, and a shower head for discharging a material gas supplied from a gas supply toward the substrate on the stage for depositing a thin film on the substrate, the shower head comprising a first planar member disposed in confronting relation to the substrate, a second planar member disposed in confronting relation to the gas supply, the first planar member and the second planar member defining therebetween a circulatory space for circulating a heating medium therein, and a plurality of nozzle pipes disposed in the circulatory space and extending through the first planar member and the second planar member, each of the nozzle pipes having a nozzle equipped therein. The nozzle pipes are heated to the temperature of the heating medium in the circulatory space through a heat exchange with the heating medium. If the heating medium is controlled at a temperature of 250° C.±2%, for example, the material gas flowing through the nozzles in the nozzle pipes is also heated to that temperature. Accordingly, the material gas which is heated uniformly to a high temperature can be supplied at a uniform density from the shower head across its entire surface onto the substrate.

The shower head may further comprise a plurality of ribs disposed between the first planar member and the second planar member, the ribs defining a circulatory flow path for circulating the heating medium in the circulatory space. The circulatory flow path can easily be defined in the shower head with the ribs. The heating medium can smoothly flow through the circulatory flow path thus defined.

Each of the nozzle pipes may comprise a cylinder or a rectangular shape having an outer surface exposed to the circulatory space and held in contact with the heating medium. The nozzle pipes permit a heat exchange to be conducted easily between the gas flowing through the nozzles and the heating medium, for thereby producing a flow of the material gas which has been heated uniformly to a high temperature.

The circulatory flow path may comprise a plurality of flow paths which include two flow paths extending substantially parallel to each other and disposed closely to each other, the flow paths being arranged to direct the heating medium in opposite directions, respectively, therein. Consequently, the temperature difference between inlet and outlet ends of one of the flow paths is offset by the temperature difference between inlet and outlet ends of the other flow path, so that the entire surface of the shower head can be heated to a uniform temperature.

Each of the nozzle pipes may be integrally formed with at least one of the first planar member and the second planar member. Therefore, it is not necessary to weld separate nozzle pipes to the first planar member or the second planar member, and the shower head suffers less strains caused by a welding process. Furthermore, the shower head can be machined with ease.

According to a further aspect of the present invention, there is provided a thin-film vapor deposition apparatus comprising a reaction casing defining a reaction chamber, a stage for supporting a substrate, the stage being disposed in the reaction chamber, and a shower head for discharging a material gas supplied from a gas supply toward the substrate on the stage for depositing a thin film on the substrate, the shower head comprising a first planar member disposed in confronting relation to the substrate, a second planar member disposed in confronting relation to the gas supply, and a plurality of ribs disposed between the first planar member and the second planar member and defining a circulatory flow path therebetween for circulating a heating medium therein, the ribs having a plurality of nozzles defined therein and extending through the first planar member and the second planar member. The shower head may further comprise a ring fitted over the ribs and having recesses defined in an inner circumferential surface as part of the circulatory flow path, the ribs being integrally formed on the first member, the second member having a plurality of apertures defined therein and held in registry with the nozzles, respectively. Because the nozzles are defined in the ribs of the shower head, it is not necessary to manufacture and assemble any separate nozzle pipes. Accordingly, the shower head is free from strains which would otherwise be caused if separate nozzle piles were welded. Furthermore, the shower head can be machined with ease.

According to a still further aspect of the present invention, there is provided a method of depositing a thin film on a substrate by discharging a material gas toward the substrate which is heated in a reaction chamber, comprising the steps of circulating a heating medium in a shower head having a plurality of nozzles for discharging the material gas therethrough toward the substrate, and heating the nozzles with the heating medium to heat the material gas uniformly to a predetermined temperature while the material gas is being discharged at a uniform density to deposit the thin film on the substrate. The material gas supplied onto the substrate is heated uniformly to a high temperature and has a uniform density. Therefore, it is possible to deposit a thin film of uniform composition and thickness on the entire surface of the substrate. The material gas which may comprise an organic metal gas is highly sensitive to temperatures. If no accurate temperature control were effected on passages for the material gas, then the material gas would tend to be condensed or produce a reactive product tending to be deposited in the passages. Since, however, the material gas is controlled at a predetermined temperature when it flows through the nozzles, it does not clog the nozzles, and hence can deposit a high-quality thin film of metal oxide on the substrate.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
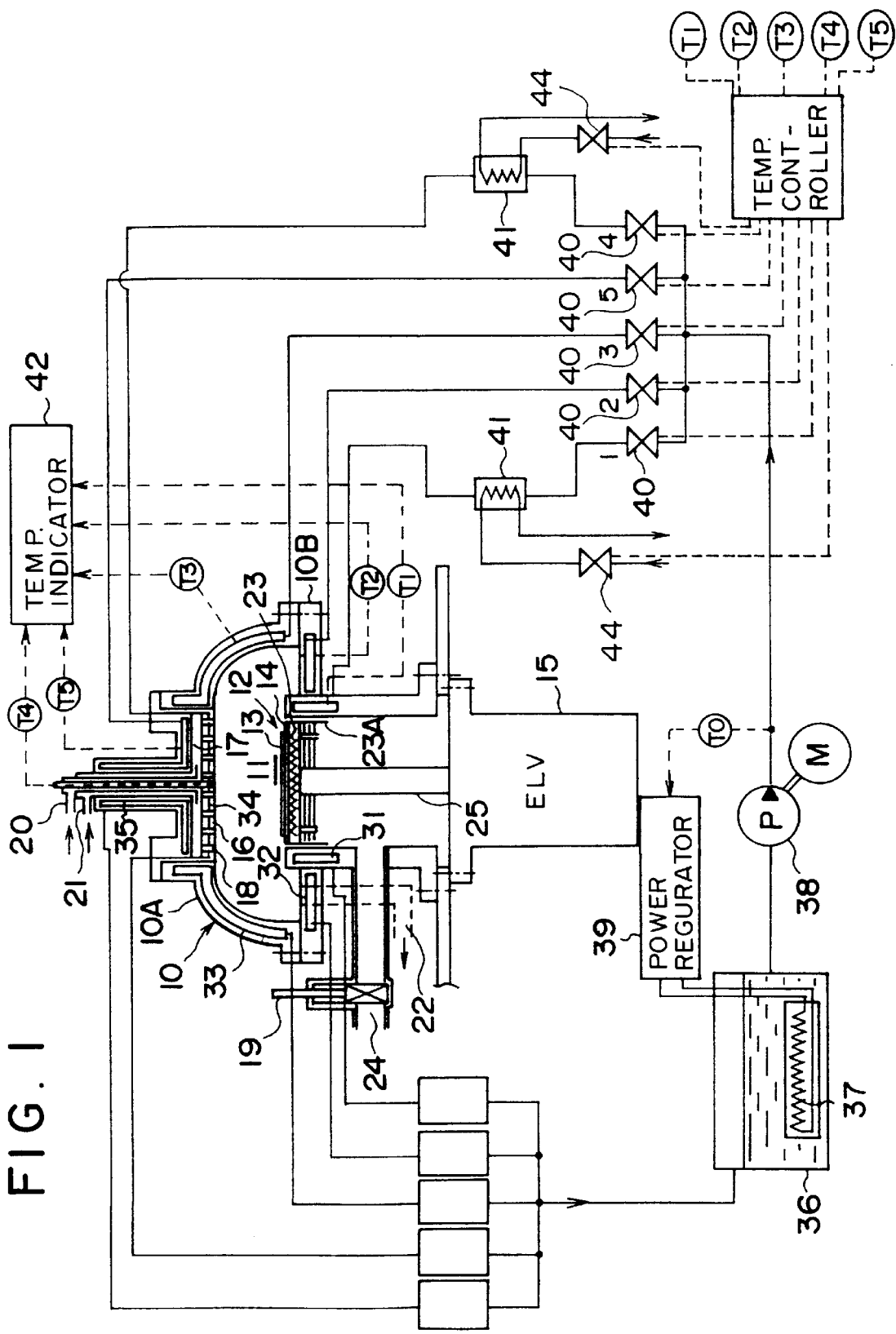
FIG. 1 is a schematic view of a thin-film vapor deposition apparatus according to the present invention.

Like or corresponding parts are denoted by like or corresponding reference numerals throughout the drawings.

As shown in FIG. 1, a thin-film vapor deposition apparatus according to the present invention has a reaction casing 10 and a shower head 16 which define a reaction chamber 11 above a susceptor 14 which supports a substrate 13, such as a semiconductor substrate, thereon. The reaction casing 10 supports shower head 16 disposed above the susceptor 14 and having a plurality of nozzles 18 for discharging a metal material gas and an oxygen-containing gas into the reaction chamber 11 over the substrate 13 placed on the susceptor 14. The reaction casing 10 may contain the shower head 16 therein to define the reaction chamber 11 by the reaction casing itself. The metal material gas introduced into the reaction chamber 11 reacts with the oxygen-containing gas to deposit a thin film of a metal oxide on the substrate 13. The metal material gas may comprise a vaporized mixture of organic metals including $Ba(DPM)_2$, $Sr(DPM)_2$, and/or $Ti(i—OCH_7)_4$ which is carried by a carrier gas such as AR or the like. The oxygen-containing gas may comprise an oxide gas such as $O_2$, $N_2O$, $H_2O$, ozone ($O_3$), or the like.

The reaction casing 10 comprises a casing member 10A of an inverted pot shape and a support base 10B which supports the casing member 10A. The reaction chamber 11 is hermetically sealed between the casing member 10A and the support base 10B on which the casing member 10A is disposed. The shower head 16 is in the form of a disk positioned centrally in the casing member 10A above the reaction chamber 11. A space 17 that is defined above the shower head 16 is held in communication with gas inlet tubes 20, 21 for introducing the oxygen-containing gas and the metal material gas, respectively.

The support base 10B has a central opening defined therein below the reaction chamber 11. The susceptor 14 is supported on a stage 12 which is vertically movably disposed in the central opening of the support base 10B. The stage 12 is supported on an upper end of a vertical rod 15A which can be vertically moved by an elevator mechanism 15 connected to a lower end of the vertical rod 15A. The stage 12 is shown in FIG. 1 as being slightly lower than a vertical position which it takes while a thin film is being deposited on the substrate 13 on the susceptor 14 during a vapor deposition process. When the vapor deposition process is completed, the stage 12 is lowered by the elevator mechanism 15 to a vertical position which is horizontally aligned with a substrate loading/unloading slot 24, and the processed substrate 13 is unloaded from and a new substrate 13 is loaded onto the susceptor 14 through the substrate loading/unloading slot 24 by a robot hand (not shown). A gate valve 19 selectively opens and closes the substrate loading/unloading slot 24 into and out of communication with a substrate delivery chamber (not shown) which is connected thereto.

The metal material gas is introduced through the gas inlet tube 21 into the space 17, and the oxygen-containing gas is introduced through the gas inlet tube 20 into the space 17. In the space 17, the metal material gas and the oxygen-containing gas are mixed with each other. The mixed gases are then discharged through the nozzles 18 into the reaction chamber 11. In the reaction chamber 11, the metal material gas and the oxygen-containing gas react with each other, producing metal-oxide molecules of barium titanate, strontium titanate, or the like, which are deposited as a metal-oxide thin film on the substrate 13. Gases remaining in the reaction chamber 11 after such reaction and excessive gases are discharged from the reaction chamber 11 through a gas outlet port 22.

For forming high-quality thin films of metal oxide during the vapor deposition process, it is highly important to control the temperatures of the reactive gases and the substrate 13. The temperature of the substrate 13 is required to be adjustable in the range of from 400° C. to 700° C. with a temperature accuracy of about ±1% at 550° C., for example. To control the temperature of the reactive gases, the temperature of the shower head 16 and the inner wall of the reaction casing 10 is required to be adjustable in the range of from 250° C. to 260° C. with a temperature accuracy of about ±2%.

To heat the substrate 13, the stage 12 has a substrate heater unit 23 disposed underneath the susceptor 14 which supports the substrate 13 thereon.

To control the temperature of the reactive gases in the reaction chamber 11, flow paths for delivering a heating medium are disposed around the casing member 10A, the support base 10B, the shower head 16, and the gas inlet tubes 20, 21 for heating the reactive gases to a desired temperature. The heating medium comprises a liquid-phase fluid which is circulated through the flow paths to control the temperature of the reactive gases. For example, the heating medium may be a fluorine-base liquid-phase fluid such as perfluoropolyether which is nonflammable and hence free from the danger of explosions and which is of good heat transfer characteristics for efficient and stable heat exchange capability. The heating medium may alternatively be alkyl diphenyl, paraffin oil, mineral oil, silicone oil, or the like.

In this embodiment, there are five groups of flow paths. The flow paths for delivering the heating medium are grouped into first, second, third, fourth, and fifth flow path systems 31, 32, 33, 34, 35. These first through fifth flow path systems 31, 32, 33, 34, 35 serve to independently control the temperatures of the casing member 10A, the support base 10B, the shower head 16, and the gas inlet tubes 20, 21. The heating medium is contained in a tank 36 housing therein an oil-heated heater 37 which heats the heating medium to a temperature set by a power regulator 39. The heating medium which is heated by the oil-heated heater 37 is delivered by a pump 38 to the first through fifth flow path systems 31, 32, 33, 34, 35 which are positioned in respective regions of the thin-film vapor deposition apparatus. A thermocouple TO detects the temperature of the heating medium discharged by the pump 38, and sends a detected temperature signal to the power regulator 39 to keep the heating medium at the preset temperature with the oil-heated heater 37 under feedback control. The first through fifth flow path systems 31, 32, 33, 34, 35 have respective flow rate regulating valves 40 for regulating the rates of flow of the heating medium in the respective first through fifth flow path systems 31, 32, 33, 34, 35 thereby to adjust the amounts of thermal energy supplied to the respective regions of the thin-film vapor deposition apparatus.

The first and fourth flow path systems 31, 34 are combined with respective heat exchangers 41 where the temperature of the heating medium is lowered by a water coolant supplied thereto for reducing the amount of thermal energy supplied to the flow paths in the reaction casing 10. The reaction casing 10 which surrounds the reaction chamber 11 and the shower head 16 are combined with thermocouples T1, T2, T3, T4, T5 for detecting the temperatures of inner wall regions of the reaction chamber 11 where the flow paths of the first through fifth flow path systems 31, 32, 33, 34, 35 are installed, respectively. The thermocouples T1, T2, T3, T4, T5 are connected to a temperature indicator 42 which indicates the detected temperatures. The temperatures detected by the thermocouples T1, T2, T3, T4, T5 are transmitted to a temperature controller 43, which adjusts the openings of the flow rate regulating valves 40 to regulate the rates of flow of the heating medium for thereby controlling the temperatures of the inner wall regions of the reaction chamber 11. The temperature controller 43 can also adjust the openings of flow control valves 44 connected to the respective heat exchangers 41.

The first flow path system 31 is disposed in a cylindrical space within the central opening defined in the support base 10B around the stage 12. The first flow path system 31 is subject to the heat produced by the substrate heater unit 23. Therefore, the inner circumferential edge of the support base 10B tends to be heated to a high temperature. In order to set the temperature for the thermocouple T1 to 250° C., for example, the regulation of the rate of flow by the associated flow rate regulating valve 40 is not sufficient to achieve such a temperature setting, but the associated heat exchanger 41 is additionally effective to lower the temperature of the heating medium flowing in the first flow path system 31 for attaining the temperature setting.

A skirt 23A which comprises a shield plate joined to the stage 12 is disposed in the cylindrical space between the stage 12 and the support base 10B disposed near the stage 12 and spaced from the stage 12. The skirt 23A serves to block the radiant heat generated by the substrate heater unit 23 to facilitate temperature control for the support base 10B.

The fourth flow path system 34 is disposed in the shower head 16 and positioned across the reaction chamber 11 from the susceptor 14. The susceptor 14 is kept at a temperature of 550° C., for example, by the substrate heater unit 23.

During a vapor deposition process, since the susceptor 14 is located closely to the shower head 16, the temperature of the shower head 16 tends to be increased because of the heat from the susceptor 14. Lowering the temperature of the heating medium in the fourth flow path system 34 with the associated heat exchanger 41 is effective to keep the temperature of the shower head 16 at 250° C.±2%.

The flow paths of the first through fifth flow path systems 31, 32, 33, 34, 35 will be described below with reference to FIGS. 2 through 6. Each of the flow paths of the first through fifth flow path systems 31, 32, 33, 34, 35 is of a continuous flow pattern for circulating the heating medium through the corresponding region in the reaction casing 10 without causing the heating medium to be stagnant somewhere in the flow path. The flow paths of the first through fifth flow path systems 31, 32, 33, 34, 35 have upstream portions positioned in regions where the accuracy of temperature control is important, e.g., a region close the inner wall of the reaction chamber 11, a region close to the substrate heater unit 23, and a region close to the nozzles 18 of the shower head 16.

Figure 2:
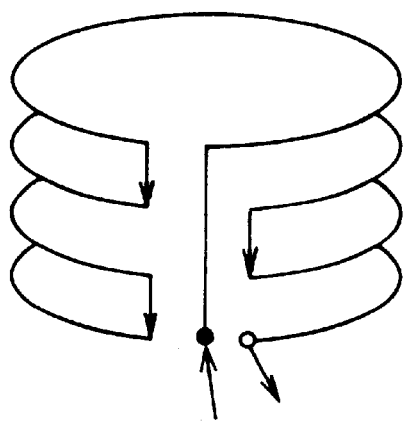
FIG. 2 is a schematic view of the flow pattern of a first flow path system.

The first flow path system 31 which is disposed around the stage 12 is of a cylindrical flow pattern shown in FIG. 2. As shown in FIG. 2, the first flow path system 31 has a vertical array of substantially circular concentric flow paths lying in substantially horizontal planes, respectively. Specifically, the flow paths include an uppermost flow path connected to an inlet port and running counterclockwise along a partial circumferential length shorter than a full circumferential length and a lower flow path connected to the uppermost flow path and running clockwise along a partial circumferential length shorter than a full circumferential length. The flow paths also include other flow paths which are an exact repetition of the above uppermost and lower flow paths. The first flow path system 31 of such a cylindrical flow pattern is capable of uniformly heating the cylindrical space in which it is disposed to a temperature ranging from 250° C. to 260° C.

Figure 3:
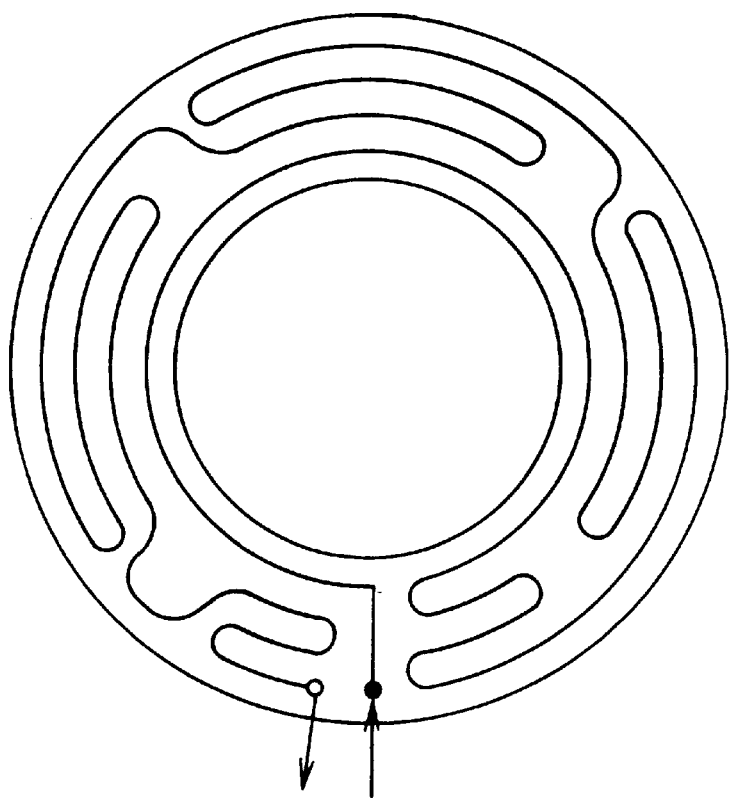
FIG. 3 is a schematic view of the flow pattern of a second flow path system.

The second flow path system 32 is disposed in a flat disk-shaped portion of the support base 10B which lies around the first flow path system 31 which is positioned in the cylindrical space around the stage 12. The second flow path system 32 has a flow pattern shown in FIG. 3. As shown in FIG. 3, the second flow path system 32 includes an inner circular flow path connected to an inlet port and running clockwise substantially fully circumferentially around the inner circumferential edge of the flat disk-shaped portion of the support base 10B, where the accuracy of temperature control is important, and an outer substantially circular flow path which extends in a zigzag configuration around the inner circular flow path along the outer inner circumferential edge of the flat disk-shaped portion of the support base 10B. The second flow path system 32 of the flow pattern shown in FIG. 3 is capable of uniformly heating the flat disk-shaped portion of the support base 10B.

Figure 4:
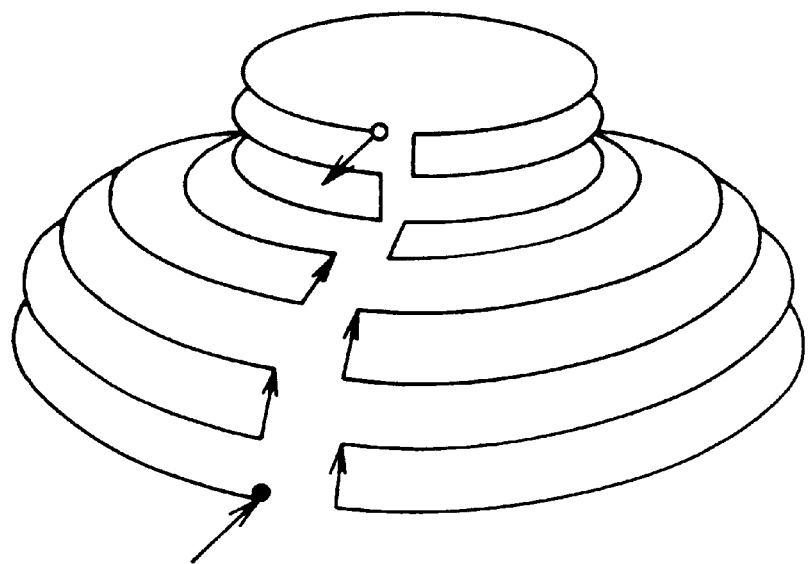
FIG. 4 is a schematic view of the flow pattern of a third flow path system.

The third flow path system 33 is disposed in the casing member 10A of an inverted pot shape. The third flow path system 33 has a substantially conical flow pattern shown in FIG. 4. As shown in FIG. 4, the third flow path system 33 has a conical array of substantially circular concentric flow paths lying in substantially horizontal planes, respectively. Specifically, the flow paths include a lowermost flow path connected to an inlet port and running clockwise along a partial circumferential length shorter than a full circumferential length and an upper flow path connected to the lowermost flow path and running counterclockwise along a partial circumferential length shorter than a full circumferential length. The flow paths also include other flow paths of successively smaller diameters which extend in a repetition of the above lowermost and upper flow paths. The third flow path system 33 of such a substantially conical flow pattern is disposed substantially fully in the casing member 10A and is, and capable of uniformly heating the casing member 10A.

Figure 5:
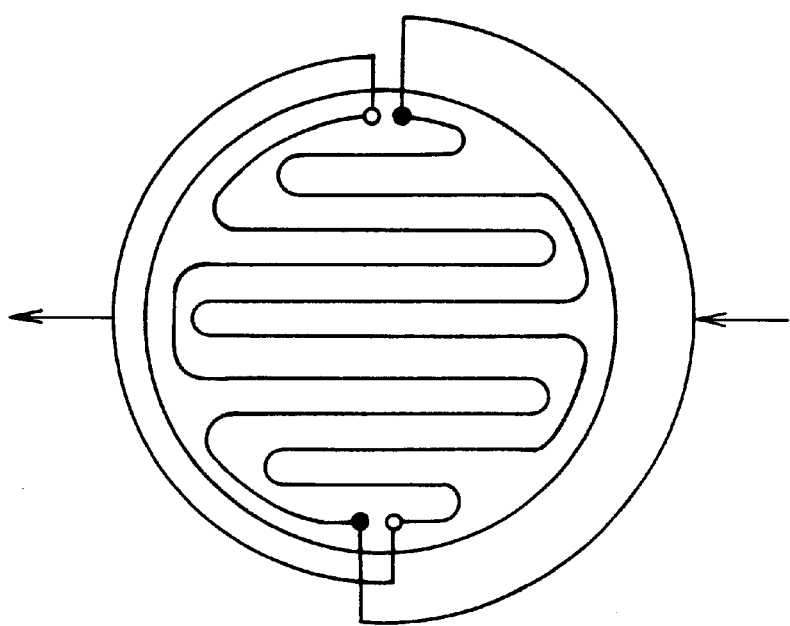
FIG. 5 is a schematic view of the flow pattern of a fourth flow path system.

The fourth flow path system 34 which is disposed in the shower head 16 has a flow pattern shown in FIG. 5. The fourth flow path system 34 is required to control the temperature of the shower head 16 particularly uniformly and accurately so that the reactive gases which flow through the nozzles 18 prior to being introduced into the reaction chamber 11 will not be condensed and deposited in the nozzles 18 or will not clog the nozzles 18 with a product generated by the reaction between the reactive gases. As shown in FIG. 5, the fourth flow path system 34 includes a flow path connected to an inlet port and branched into two quarter arcuate flow paths which are disposed outside of the shower head 16 and connected to respective two interdigitating opposite zigzag flow paths disposed in the shower head 16. The zigzag flow paths are connected to respective two quarter arcuate flow paths which are disposed outside of the shower head 16 and connected to an outlet port.

Figure 6:
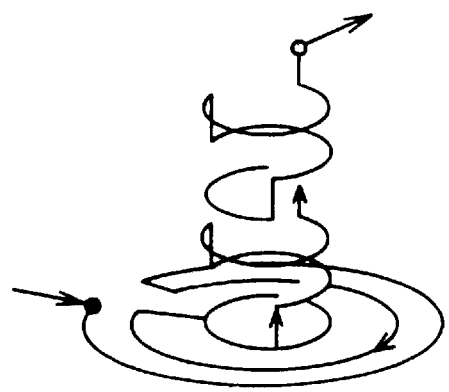
FIG. 6 is a schematic view of the flow pattern of a fifth flow path system.

The fifth flow path system 35 is disposed above the space 17 for heating the gas inlet tubes 20, 21 and the space 17, and has a flow pattern shown in FIG. 6. The shower head 16 has an upper disk-shaped upper surface, and includes a vertical cylindrical portion which is vertically disposed above the space 17, the gas inlet tubes 20, 21 being housed in and extending vertically downwardly in the vertical cylindrical portion. The fifth flow path system 35 has a substantially circular horizontal pattern of flow paths including an outermost flow path connected to an inlet port and running counterclockwise along a partial circumferential length shorter than a full circumferential length and an inner flow path connected to the outermost flow path and running clockwise along a partial circumferential length shorter than a full circumferential length, and a substantially cylindrical vertical array of flow paths including a lowermost flow path connected to the inner flow path and vertically spaced upper flow paths running alternately counterclockwise and clockwise, each along a partial circumferential length shorter than a full circumferential length. The substantially circular horizontal pattern of flow paths is disposed above the space 17 over the upper disk-shaped upper surface of the shower head 16, and the substantially cylindrical vertical array of flow paths is disposed in the cylindrical structure which is vertically disposed above the space 17 above the shower head 16.

Figure 7:
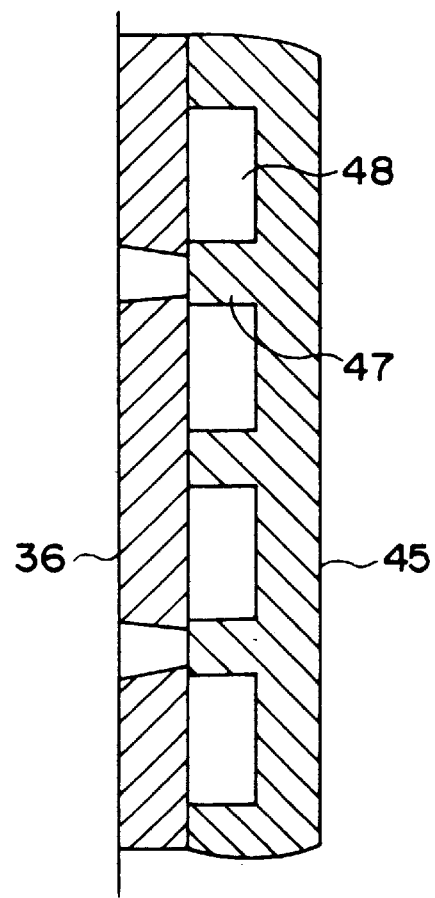
FIG. 7 is a fragmentary vertical cross-sectional view of a structure of each of the first, third, and fifth flow path systems.

FIG. 7 shows in fragmentary vertical cross section a cylindrical structure of each of the first, third, and fifth flow path systems 31, 33, 35. Specifically, the cylindrical structure shown in FIG. 7 is incorporated in the casing member 10A of the reaction casing 10. As shown in FIG. 7, the casing member 10A comprises an inner wall 45 and an outer wall 46 which are joined to each other. The inner wall 45 has a plurality of vertically spaced ribs 47 integral therewith and projecting outwardly. The outer wall 46 has an inner surface welded to the outer ends of the ribs 47 by electron beam welding or plug welding, thereby joining the inner wall 45 and the outer wall 46 to each other. The ribs 47 define flow paths 48 between the inner wall 45 and the outer wall 46. The flow paths 48 can easily be formed in the inner wall 45 because the outer surface of the inner wall 45 is machined circumferentially at axially spaced intervals, rather than being helically machined, to produce the ribs 47. The ribs 47 may be welded to the outer surface of the inner wall 45 or produced by a milling machine or the like.

Each of the heat exchangers 41 is cooled by a water coolant. However, it may be cooled by air with a longer metal piping used to pass air than the water-cooled heat exchanger arrangement. In the illustrated embodiment, the flow path 48 is defined by ribs 47 between the inner wall 45 and the outer wall 46. However the flow path may be formed by a pipe attached around the wall. Also, the temperatures of the various regions in the reaction chamber 11, which are controlled by the first through fifth flow path systems 31, 32, 33, 34, 35, are adjusted by adjusting the openings of the flow rate regulating valves 40 to regulate the rates of flow of the heating medium in the respective first through fifth flow path systems 31, 32, 33, 34, 35. However, the first through fifth flow path systems 31, 32, 33, 34, 35 may have respective in-line heaters, rather than the flow rate regulating valves 40, and the temperatures of the various regions in the reaction chamber 11 may be controlled by adjusting the amounts of thermal energy produced by the in-line heaters with constant flow rate of heating medium. Alternatively, the flow rate regulating valves 40 and the in-line heaters may be combined with each other to control the temperatures of the various regions in the reaction chamber 11 in a wider range of temperatures.

Operation of the thin-film vapor deposition apparatus according to the present invention for depositing a thin film of metal oxide in a vapor phase will be described below. First, the reaction chamber 11 is evacuated, and the stage 12 is lowered to the vertical position of the substrate loading/unloading slot 24 by the elevator mechanism 15. Then, the gate valve 19 is opened, and a substrate 13 is placed on the susceptor 14 by the non-illustrated robot hand. Thereafter, the gate valve 19 is closed, and the stage 12 is lifted by the elevator mechanism 15. The substrate 13 on the susceptor 14 is heated to a temperature of 550° C.±1%, for example, by the substrate heater unit 23 in the stage 12. The pump 38 is operated to circulate the heating medium, which has been heated to a temperature set by the power regulator 39 by the heater 37 in the tank 36.

The temperature controller 43 detects the temperatures of the various regions of the reaction chamber 10 through the thermocouples T1–T5, and controls the temperatures at desired values. Specifically, the temperature controller 43 controls the openings of the flow rate regulating valves 40 to adjust the temperature detected by the thermocouples T1–T5 to predetermined temperatures.

During a vapor deposition process, the stage 12 is elevated to a position close to the shower head 16. At this time, the shower head 16 is heated by the heat produced by the susceptor 14 which has been heated by the substrate heater unit 23. However, the temperature controller 43 adjusts the opening of the flow control valve 44 connected to the heat exchanger 41 in the fourth flow path system 34 to change the rate of flow of the heating medium in the fourth flow path system 34 for lowering the temperature of the heating medium flowing through the shower head 16. Accordingly, the shower head 16 can be adjusted to a constant temperature of about 250° C., for example, even when the susceptor 14 is positioned near the shower head 16.

Similarly, the first flow path system 31 disposed around the stage 12 is heated by the heat which is produced by the substrate heater unit 23. However, the temperature controller 43 also adjusts the opening of the flow control valve 44 connected to the heat exchanger 41 in the first flow path system 31 to change the rate of flow of the heating medium in the first flow path system 31 for lowering the temperature of the heating medium flowing through the first flow path system 31. Accordingly, the first flow path system 31 can be adjusted to a constant temperature of about 250° C., for example, even when it is heated by the substrate heater unit 23.

An organic metal gas is introduced from the gas inlet tube 21 into the space 17, and an ozone($O_3$)-containing oxygen gas is introduced from the gas inlet tube 20 into the space 17. The introduced gases are mixed with each other in the space 17, and then discharged through the nozzles 18 onto the substrate 13 on the susceptor 12. In the reaction chamber 11, the organic metal gas and the oxygen-containing gas react with each other, producing metal-oxide molecules of barium titanate, strontium titanate, or the like, which are deposited as a metal-oxide thin film on the substrate 13. After the vapor deposition process, the stage 12 is lowered to the vertical position of the substrate loading/unloading slot 24 by the elevator mechanism 15. Then, the gate valve 19 is opened, and the substrate 13 is removed from the susceptor 14 by the non-illustrated robot hand.

In this embodiment, the thin-film vapor deposition apparatus has the five flow path systems 31, 32, 33, 34, 35 for independently controlling the temperatures of the casing member 10A, the support base 10B, the shower head 16, and the gas inlet tubes 20, 21. However, the number of flow path systems may be selected as desired depending on the structure of the thin-film vapor deposition apparatus and the vapor-phase film growth conditions insofar as the flow path systems can keep the reaction chamber and the gas inlet tubes at desired temperatures.

In the vapor deposition process, the reaction chamber 11 is typically evacuated to several Torr. However, the reaction chamber 11 may be evacuated to a desired vacuum level depending on the conditions of the reactive gases to be introduced into the reaction chamber 11.

While the thin-film vapor deposition apparatus is described with respect to a vapor deposition process for depositing in a vapor or gas phase a thin film of barium titanate, strontium titanate, or the like, the thin-film vapor deposition apparatus may be used to deposit in a vapor or gas phase a superconducting thin film of a rare-earth element which requires strict temperature control.

Figure 8:
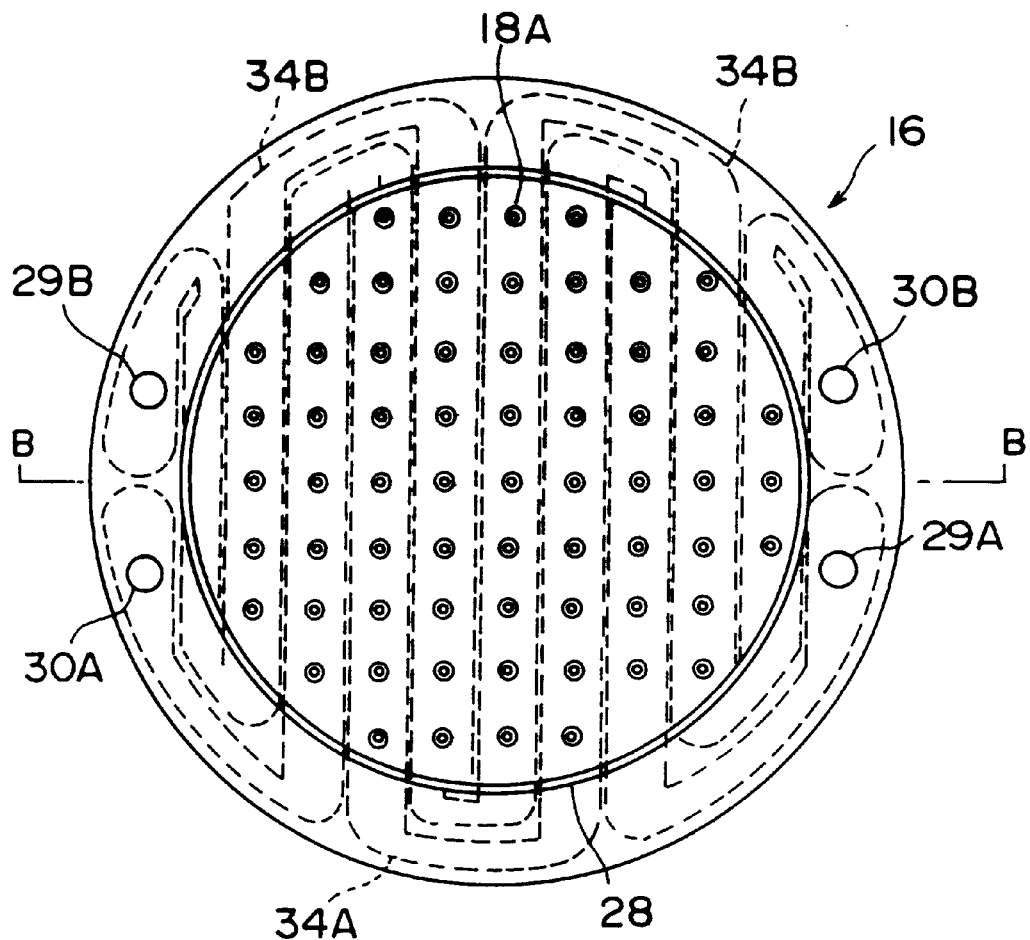
FIG. 8 is a plan view of a shower head of the thin-film vapor deposition apparatus shown in FIG. 1.
Figure 9:
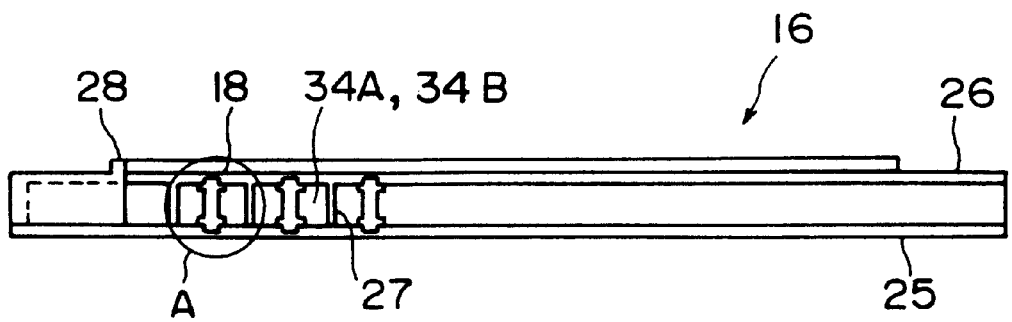
FIG. 9 is a fragmentary sectional side elevational view of the shower head.

FIGS. 8 and 9 show the shower head 16 in greater detail.

As shown in FIGS. 8 and 9, the shower head 16 comprises a first planar disk-shaped member (lower member) 25 which faces the substrate 13 on the susceptor 14 and a second planar disk-shaped member (upper member) 26 which faces the space 17. The second member 26 is spaced upwardly from the first member 25 by a plurality of vertical parallel ribs 27 which extend from the second member 26 and are held in abutment against the first member 25. The ribs 27 define a circulatory system of flow paths between the first and second members 25, 26 for circulating the heating medium therethrough. The circulatory system of flow paths defined by the ribs 27 between the first and second members 25, 26 corresponds to the fourth flow path system 34 which has the flow pattern described above with reference to FIG. 5. The second member 26 has an annular ridge 28 disposed on an upper surface thereof along an outer circumferential edge thereof and projecting upwardly. The annular ridge 28 serves to fit the shower head 16 in the casing member 10A of the reaction casing 10.

The shower head 16 also has a plurality of cylindrical nozzle pipes 18A extending vertically between the first and second members 25, 26 and spaced at constant distances in a matrix within a circular area surrounded by the annular ridge 28.

The circulatory system of flow paths defined by the ribs 27 between the first and second members 25, 26 includes two zigzag flow paths 34A, 34B indicated by the dotted lines in FIG. 8. The nozzle pipes 18A(18B) are disposed in the central portion of the flow paths. Further, the annular ridge 28 is used for fixing the shower head 16 to the casing member 10A of an inverted pot shape.

The flow path 34A has an end connected to an inlet port 29A defined in the second member 26 outside of the annular ridge 28, extends in a zigzag pattern between the first and second members 25, 26, and has an opposite end connected to an outlet port 30A defined in the second member 26 outside of the annular ridge 28 in diametrically opposite relation to the inlet port 29A. Similarly, the flow path 34B has an end connected to an inlet port 29B defined in the second member 26 near the outlet port 30A outside of the annular ridge 28, extends in a zigzag pattern between the first and second members 25, 26, and has an opposite end connected to an outlet port 30B defined in the second member 26 near the inlet port 29A outside of the annular ridge 28 in diametrically opposite relation to the port 30A. The inlet ports 29A, 29B are supplied with the heating medium branched from the flow path extending from the flow rate regulating valve 40 associated with the fourth flow path system 34. Since the inlet port 29A of the flow path 34A and the outlet port 30B of the flow path 34B are positioned closely to each other and the inlet port 29B of the flow path 34B and the outlet port 30A of the flow path 34A are positioned closely to each other, the temperature difference between the inlet and outlet ports 29A, 30A of the flow path 34A is canceled by the temperature difference between the inlet and outlet ports 29B, 30B of the flow path 34B, so that the temperature is made uniform over the entire surface of the shower head 16.

Figure 10:
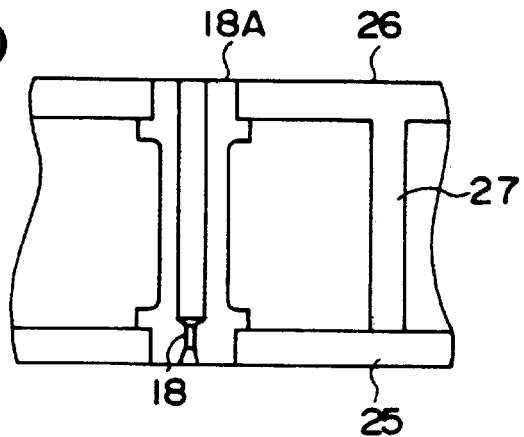
FIG. 10 is an enlarged fragmentary cross-sectional view of a nozzle of the shower head.

FIG. 10 shows at enlarged scale a portion of the shower head 16 which is encircled at A in FIG. 9. As shown in FIG. 10, each of the cylindrical nozzle pipes 18A has a nozzle 18 positioned centrally in a lower end thereof, and has its circumferential outer wall disposed in one of the flow paths defined by the ribs 27 between the first and second members 25, 26. Therefore, the cylindrical nozzle pipes 18A are immersed in the heating medium heated to a predetermined temperature and flowing through the flow paths defined by the ribs 27 between the first and second members 25, 26. Each of the cylindrical nozzle pipes 18A has upper and lower ends securely fitted in nozzle holes defined in the respective first and second members 25, 26. The upper and lower ends of the circumferential outer walls of each of the cylindrical nozzle pipes 18A are welded in their entirety to the respective first and second members 25, 26. The circumferential outer walls of each of the cylindrical nozzle pipes 18A have upper and lower flanges held against the lower and upper surfaces, respectively, of the second and first members 26, 25. Although the ribs 27 are shown as projecting integrally downwardly from the second member 26 and abutting against the first member 25 in FIG. 10, the ribs 27 may project integrally upwardly from the first member 25 and abut against the second member 26.

Figure 11:
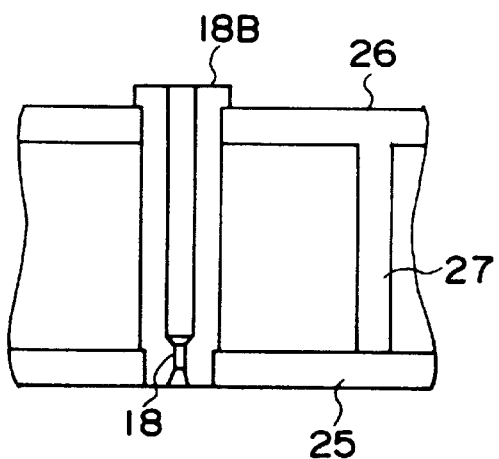
FIG. 11 is an enlarged fragmentary cross-sectional view of a nozzle according to another embodiment of the present invention.

FIG. 11 shows a nozzle according to another embodiment of the present invention. As shown in FIG. 11, a cylindrical nozzle pipe 18B with a nozzle 18 positioned in a lower end thereof is inserted in nozzle holes defined respectively in the first and second members 25, 26. The cylindrical nozzle pipe 18B has a flange on its upper end which is held against the upper surface of the second member 26, with the lower end thereof fitted in the nozzle hole in the first member 25. The upper and lower ends of the circumferential outer walls of the nozzle pipe 18B are welded in their entirety to the respective first and second members 25, 26. Since the nozzle pipe 18B can be inserted in and welded to the first and second members 25, 26 after the first and second members 25, 26 have been assembled, the shower head 16 with the nozzle pipe 18B can easily be assembled.

Figure 12:
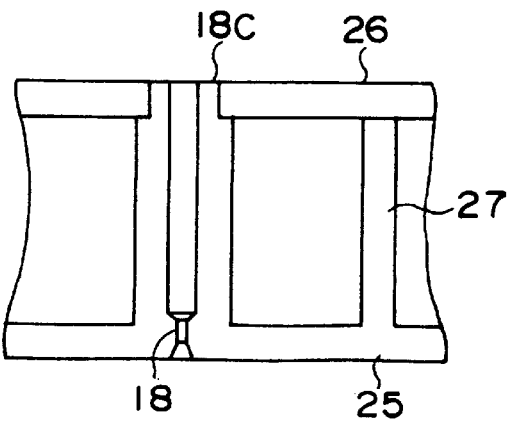
FIG. 12 is an enlarged fragmentary cross-sectional view of a nozzle according to still another embodiment of the present invention.

FIG. 12 shows a nozzle according to still another embodiment of the present invention. As shown in FIG. 12, a cylindrical nozzle pipe 18C with a nozzle 18 positioned in a lower end thereof is integrally formed with the first member 25. The ribs 27 are also integrally formed with the first member 25. Specifically, the cylindrical nozzle pipe 18C has a lower end integrally joined to the first member 25 and an upper end fitted in a nozzle hole defined in the second member 26 and welded thereto. Because the cylindrical nozzle pipe 18C is integral with the first member 25, the shower head 16 has a reduced number of welded regions and hence suffers reduced welding strains, and can easily be manufactured.

Figure 13:
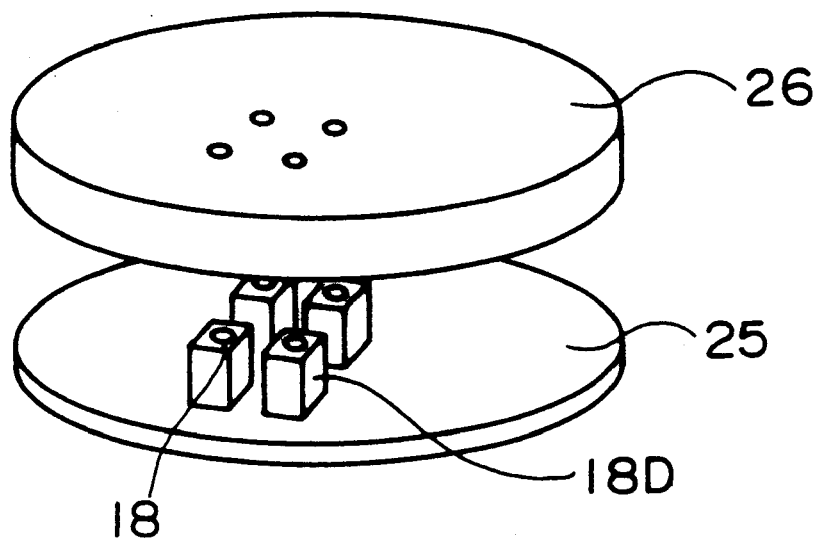
FIG. 13 is an exploded perspective view of a shower head according to yet still another embodiment of the present invention.

FIG. 13 shows in exploded perspective a shower head according to yet still another embodiment of the present invention. The shower head shown in FIG. 13 comprises first and second members 25, 26 and a plurality of nozzle pipes 18D each in the form of a rectangular shape which are integrally formed with the first member 25 and extend between the first and second members 25, 26. Each of the nozzle pipes 18D has a nozzle 18 positioned herein. The nozzle pipes 18D each in the form of a rectangular shape are arranged in a grid pattern on the first member 25. Consequently, the shower head shown in FIG. 13 can easily be machined.

Figure 14:
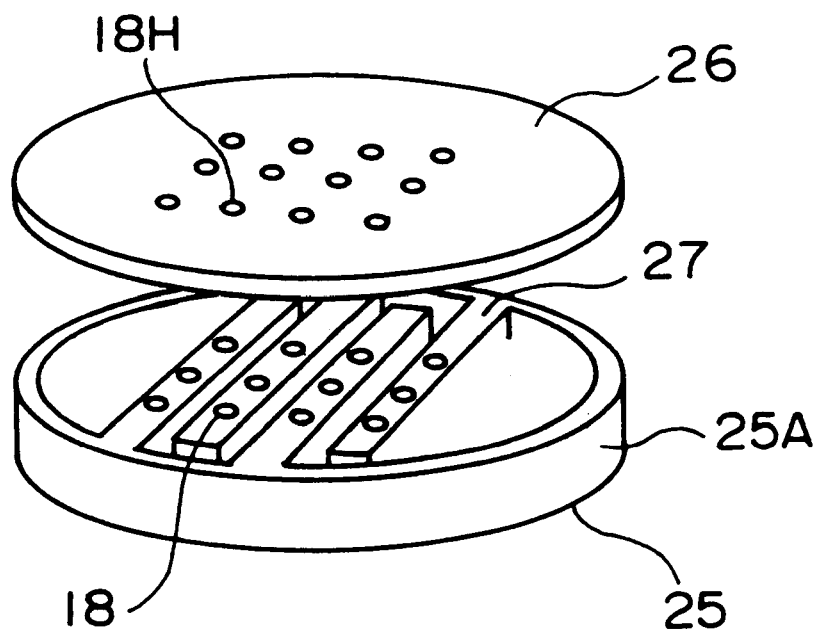
FIG. 14 is an exploded perspective view of a shower head according to a further embodiment of the present invention.

FIG. 14 shows in exploded perspective a shower head according to a further embodiment of the present invention. As shown in FIG. 14, the shower head comprises first and second members 25, 26, the first member 25 having a cylindrical wall 25A extending around its outer circumferential edge and projecting upwardly toward the second member 26. The shower head also has a plurality of vertical parallel ribs 27 integrally mounted on the first member 25 and having alternately opposite ends integrally joined to the cylindrical wall 25A. The ribs 27 are disposed in interdigitating relation to define a circulatory flow path for the heating medium. The ribs 27 have a plurality of nozzles 18 equipped therein which extend vertically through the ribs 27 and the first member 25. The second member 26 has a plurality of apertures 18H defined therein which are held in alignment with the respective nozzles 18 when the second member 26 is fixed to an upper end of the cylindrical wall 25A. The heating medium can flow smoothly through the flow path defined by the ribs 27 between the first and second members 25, 26 for thereby keeping the ribs 27 and hence the nozzles 18 at a constant temperature. Since the nozzles 18 are equipped in the ribs 27 and hence no separate nozzle pipes are needed, the shower head shown in FIG. 14 can be machined and assembled relatively easily without the need for welding such separate nozzle pipes. Inasmuch as any welding operation required to manufacture the shower head is reduced, the shower head suffers reduced welding strains, and can be manufactured relatively inexpensively.

Figure 15A:
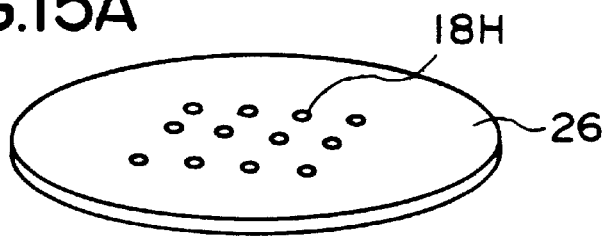
FIG. 15A is a perspective view of a lid (second planar disk-shaped member) of a shower head according to a still further embodiment of the present invention.
Figure 15B:
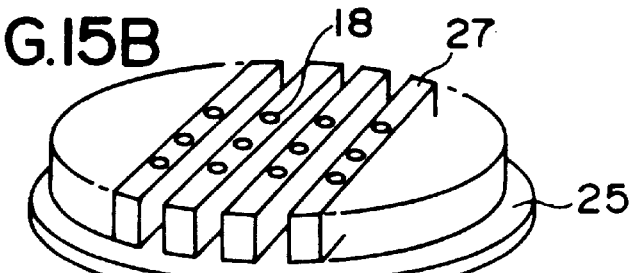
FIG. 15B is a perspective view of a first planar disk-shaped member of the shower head according to the further embodiment of the present invention.
Figure 15C:
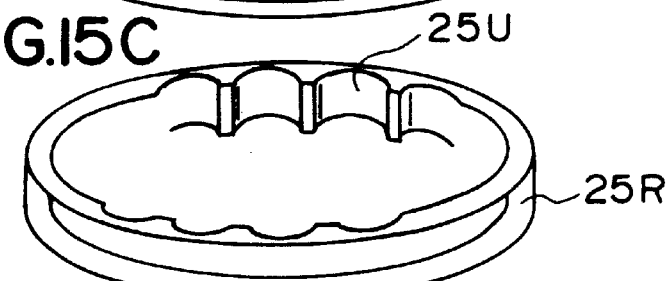
FIG. 15C is a perspective view of a ring of the shower head according to the further embodiment of the present invention.
Figure 15D:
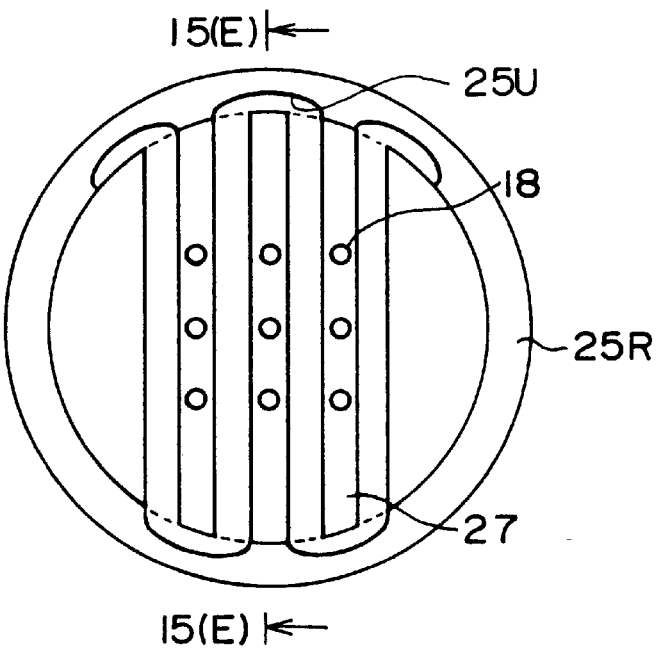
FIG. 15D is a plan view showing a flow path for a heating medium in the shower head according to the further embodiment of the present invention.
Figure 15E:
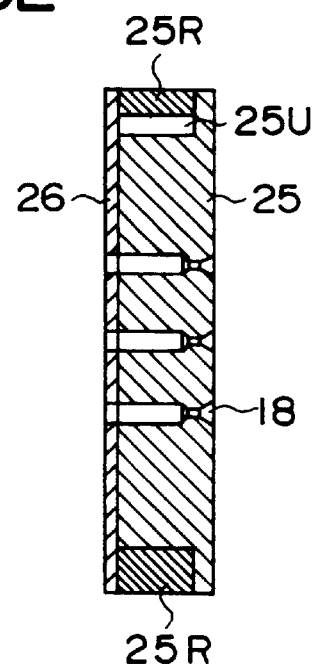
FIG. 15E is a cross-sectional view taken along line 15(E)—15(E) of FIG. 15D.

FIGS. 15A through 15E show a shower head according to a still further embodiment of the present invention. The shower head shown in FIGS. 15A through 15E is a modification of the shower head shown in FIG. 14. As shown in FIGS. 15A and 15B, the shower head has first and second members 25, 26, the first member 25 having a plurality of vertical parallel ribs 27 integrally mounted thereon the first member 25 and having a plurality of nozzles 18 equipped therein which extend vertically through the ribs 27 and the first member 25. The second member 26 has a plurality of apertures 18H defined therein which are held in alignment with the respective nozzles 18 when the first and second members 25, 26 are combined with each other. As shown in FIG. 15C, a ring 25R which is to be fitted over the ribs 27 has a plurality of U-shaped recesses 25U defined in an inner circumferential surface thereof at equally spaced intervals. FIG. 15D shows the ring 25R which is fitted over the ribs 27 on the first member 25. As shown in FIG. 15D, the recesses 25U serve as respective turns of the flow path which is defined between the ribs 27 for circulating the heating medium. The first and second members 25, 26 which are combined with each other with the ring 25R fitted over the ribs 27 are shown in cross section in FIG. 15E. Since the recesses 25U serving as flow path turns are defined in the ring 25R, the first member 25 and the ribs 27 integrally formed therewith can be machined more easily than the first member 25 and the ribs 27 shown in FIG. 14.

In the vapor deposition process, since the mixture of the organic metal gas and the oxygen-containing gas which are uniformly heated is discharged through the nozzles 18 of the shower head 16 over the entire surface of the substrate 13 on the susceptor 14, a thin film of metal oxide having a uniform composition can be deposited on entire surface of the substrate 13 at a uniform growth rate. Because the organic metal gas which is highly sensitive to temperatures is controlled highly accurately at a high temperature, as described above, it is possible to deposit a high-quality thin film of metal oxide on the substrate 13. The organic metal gas whose temperature is controlled highly accurately is prevented from being condensed in the narrow nozzles 18 or depositing a reactive product in the narrow nozzles 18.

The zigzag flow paths 34A, 34B shown in FIG. 8 may be replaced by pipes joined into a zigzag pattern, rather than the first and second members 25 and the ribs 27. While the shower head 16 shown in FIG. 8 has two zigzag flow paths 34A, 34B, it may have any desired number of flow paths depending on the structure of the thin-film vapor deposition apparatus and the vapor-phase film growth conditions insofar as they can keep the entire surface of the shower head 16 at a constant temperature.

Furthermore, the space between the first and second members 25, 26 may be divided into a plurality of compartments, and each of the compartments may have its own circulatory flow path for a heating medium. With such a modified arrangement, since the length of each circulatory flow path is relatively small, any temperature difference between inlet and outlet ends of the circulatory flow path may be reduced, and hence highly accurate temperature control may be achieved without providing the two flow paths between the first and second members 25, 26. Two flow paths may be, of course, defined in each of the compartments.

Although certain preferred embodiments of the present invention have been shown and described in detail, it should be understood that various changes and modifications may be made therein without departing from the scope of the appended claims.

What is claimed is:

1. A thin-film vapor deposition apparatus comprising:
   a reaction casing defining a reaction chamber;
   a stage for supporting a substrate, said stage being disposed in said reaction chamber;
   a shower head for discharging a material gas toward the substrate on said stare for depositing a thin film on the substrate; and
   a plurality of temperature control means, disposed in regions of said shower head and said reaction casing, for controlling temperatures of said regions, at least one of said temperature control means being arranged to pass a heating medium therethrough, said at least one of said temperature control means comprising detecting means for detecting a temperature of an inner wall of said reaction chamber, and flow rate regulating means for regulating a rate of flow of said heating medium depending on a difference between the temperature detected by said detecting means and a target temperature.

2. A thin-film vapor deposition apparatus according to claim 1, wherein said at least one of said temperature control means further comprises:

a flow path system for passing said heating medium therethrough; and cooling means disposed in said flow path system for cooling said heating medium to a temperature lower than the temperatures of regions controlled by other said temperature control means.

3. A thin-film vapor deposition apparatus comprising:

a reaction casing defining a reaction chamber;

a stage for supporting a substrate, said stage being disposed in said reaction chamber;

a shower head for discharging a material gas toward the substrate on said stage for depositing a thin film on the substrate; and a plurality of temperature control means, disposed in regions of said shower head and said reaction casing, for controlling temperatures of said regions, at least one of said temperature control means being arranged to pass a heating medium therethrough, said at least one of said temperature control means comprising a flow path system for passing said heating medium therethrough, said flow path system comprising a plurality of substantially circular concentric flow paths lying in respective substantially horizontal planes and each extending along a partial circumferential length shorter than a full circumferential length.

4. A thin-film vapor deposition apparatus comprising:

a reaction casing defining a reaction chamber;

a stage for supporting a substrate, said stage being disposed in said reaction chamber;

a shower head for discharging a material gas toward the substrate on said stare for depositing a thin film on the substrate;

a plurality of temperature control means, disposed in regions of said shower head and said reaction casing, for controlling temperatures of said regions, at least one of said temperature control means being arranged to pass a heating medium therethrough; and said reaction casing comprising an inner wall, an outer wall, a plurality of ribs projecting from said inner wall and held against said outer wall, and flow paths for passing said heating medium therethrough being defined by said ribs between said inner wall and said outer wall.

5. A thin-film vapor deposition apparatus comprising:

a reaction casing defining a reaction chamber;

a stage for supporting a substrate, said stage being disposed in said reaction chamber;

a shower head for discharging a material gas toward the substrate on said stage for depositing a thin film on the substrate;

a plurality of temperature control means, disposed in regions of said shower head and said reaction casing, for controlling temperatures of said regions, at least one of said temperature control means being arranged to pass a heating medium therethrough, said at least one of said temperature control means comprising flow path systems for passing said heating medium therethrough, at least one of said flow path systems being disposed in each of said shower head and said reaction casing; and said reaction casing comprising a casing member of an inverted pot shape connected to said shower head and a support base disposed near said stage and spaced from said stage, each of said casing member and said support base having at least one of said flow path systems.

6. A thin-film vapor deposition apparatus according to claim 5, wherein said shower head comprises a vertical cylindrical portion and a nozzle portion, each of said vertical cylindrical portion and said nozzle portion having at least one of said flow path systems.

7. A thin-film vapor deposition apparatus according to claim 5, wherein said reaction casing further comprises a shield plate disposed between said stage and said support base.

8. A thin-film vapor deposition apparatus comprising:

a reaction casing defining a reaction chamber;

a stage for supporting a substrate, said stage being disposed in said reaction chamber; and a shower head for discharging a material gas supplied from a gas supply toward the substrate on said stage for depositing a thin film on the substrate, said shower head comprising a first planar member to be disposed in confronting relation to the substrate, a second planar member to be disposed in confronting relation to the gas supply, said first planar member and said second planar member defining a circulatory space therebetween for circulating a heating medium therein, a plurality of nozzle pipes disposed in said circulatory space and extending through said first planar member and said second planar member, each of said nozzle pipes having a nozzle therein and a plurality of ribs disposed between said first planar member and said second planar member, said ribs defining a circulatory flow path for circulating the heating medium in said circulatory space.

9. A thin-film vapor disposition apparatus according to claim 8, wherein each of said nozzle pipes comprises one of a cylinder shape and a rectangular shape having an outer surface exposed to said circulatory space and held in contact with the heating medium.

10. A thin-film vapor deposition apparatus according to claim 8, wherein each of said nozzle pipes is integrally formed with at least one of said first planar member and said second planar member.

11. A thin-film vapor deposition apparatus according to claim 8, wherein said circulatory flow path comprises a plurality of flow paths.

12. A thin-film vapor deposition apparatus according to claim 11, wherein said flow paths include two flow paths extending substantially parallel to each other and disposed closely to each other, said flow paths being arranged to direct the heating medium in respective opposite directions, therein.

13. A thin-film vapor deposition apparatus comprising:

a reaction casing defining a reaction chamber;

a stage for supporting a substrate, said stage being disposed in said reaction chamber; and a shower head for discharging a material gas supplied from a gas supply toward the substrate on said stage for depositing a thin film on the substrate, said shower head comprising a first planar member to be disposed in confronting relation to the substrate, a second planar member to be disposed in confronting relation to the gas supply, and a plurality of ribs disposed between said first planar member and said second planar member and defining a circulatory flow path therebetween for circulating a heating medium therein, said ribs having a plurality of nozzles defined therein and extending through said first planar member and said second planar member.

14. A thin-film vapor deposition apparatus according to claim 13, wherein said shower head further comprises a ring fitted over said ribs and having recesses defined in an inner circumferential surface as part of said circulatory flow path, said ribs being integrally formed on said first planar member, said second planar member having a plurality of apertures defined therein and aligned with respective said nozzles.

15. A thin-film vapor deposition apparatus comprising:
 a reaction casing defining a reaction chamber;
 a stage for supporting a substrate, said stage being disposed in said reaction chamber;
 a shower head for discharging a material gas supplied from a gas supply toward the substrate on said stage for depositing a thin film on the substrate; and
 temperature control means, disposed in regions of said shower head and said reaction casing, for controlling temperatures of said shower head and said reaction chamber, said temperature control means comprising:
  a thermostatic tank for maintaining heating medium at a set temperature;
  at least two independent flow path systems for passing said heating medium therethrough from said thermostatic tank, said at least two independent flow path systems being disposed in said shower head and said reaction casing, respectively; and
  a temperature adjusting device for adjusting temperatures of said heating medium flowing in said at least two flow path systems respectively.

16. A thin-film vapor deposition apparatus according to claim 15, wherein said temperature control means further comprises:
 a detecting means for detecting a temperature of an inner wall of said reaction chamber; and
 flow rate regulating means for regulating a rate of flow of said heating medium flowing in each of said flow path systems disposed in said shower head and said reaction casing, respectively, depending on a difference between said temperature detected by said detecting means and a target temperature.

17. A thin-film vapor deposition apparatus according to claim 15, wherein said temperature control means further comprises:
 detecting means for detecting a temperature of an inner wall of said reaction chamber and a temperature of said shower head; and
 said temperature adjusting device being operable to adjust temperatures of said heating medium flowing in said at least two flow path systems according to an output signal of said detecting means.

18. A thin-film vapor deposition apparatus according to claim 15, wherein said temperature control means being operable to adjust said temperatures in a manner such that said temperatures close to said stage are lower than spaced from said stage.

19. A thin-film vapor deposition apparatus according to claim 15, wherein each said flow path system comprises a plurality of substantially circular concentric flow paths lying in respective substantially horizontal planes and each extending along a partial circumferential length shorter than a full circumferential length.

20. A thin-film vapor deposition apparatus according to claim 15, wherein said reaction casing comprises an inner wall, an outer wall, a plurality of ribs projecting from said inner wall and held against said outer wall, and said flow path system of said reaction casing for passing said heating medium therethrough is defined by said ribs between said inner wall and said outer wall.

21. A thin-film vapor deposition apparatus according to claim 15, wherein said shower head comprises a vertical cylindrical portion and a nozzle portion, each of said vertical cylindrical portion and said nozzle portion having at least one of said flow path systems.

22. A thin-film vapor deposition apparatus according to claim 15, wherein said heating medium comprises a fluorine-base liquid-phase fluid.

23. A thin-film vapor deposition apparatus according to claim 15, wherein the thin film comprises a thin film of metal oxide, and the material gas comprises an organic metal gas and an oxygen-containing gas.

24. A thin-film vapor deposition apparatus according to claim 15, wherein said reaction casing comprises a casing member of an inverted pot shape connected to said shower head and a support base disposed near said stage and spaced from said stage, each of said casing member and said support base having at least one of said flow path systems.

25. A thin-film vapor deposition apparatus according to claim 24, wherein said reaction casing further comprises a shield plate disposed between said stage and said support base.

26. A thin-film vapor deposition apparatus according to claim 15, wherein said temperature adjusting device comprises a heat exchanger for exchanging heat between said heating medium with a second medium.

27. A thin-film vapor deposition apparatus according to claim 26, wherein said temperature adjusting device comprises means for adjusting a flow rate of said second medium.

28. A thin-film vapor deposition apparatus comprising:
 a reaction casing defining a reaction chamber;
 a stage for supporting a substrate, said stage being disposed in said reaction chamber;
 a shower head for discharging a material gas toward the substrate on said stage for depositing a thin film on the substrate; and
 temperature control means, disposed in regions of said shower head and said reaction casing, for controlling temperatures of said reactions, said temperature control means comprising at least two independent flow path systems for passing said heating medium therethrough, said at least two independent flow path systems being disposed in said shower head and said reaction casing, respectively each said flow path system comprising a plurality of substantially circular concentric flow paths lying in respective substantially horizontal planes and each extending along a partial circumferential length shorter than a full circumferential length.

29. A thin-film vapor deposition apparatus according to claim 28, wherein said temperature control means further comprises:
 a detecting means for detecting a temperature of an inner wall of said reaction chamber; and
 flow rate regulating means for regulating a rate of flow of said heating medium flowing in each of said flow path systems disposed in said shower head and said reaction casing, respectively, depending on a difference between said temperature detected by said detecting means and a target temperature.

30. A thin-film vapor deposition apparatus according to claim 28, wherein said shower head comprises a vertical cylindrical portion and a nozzle portion, each of said vertical cylindrical portion and said nozzle portion having at least one of said flow path systems.

31. A thin-film vapor deposition apparatus according to claim 28, wherein said heating medium comprises a fluorine-base liquid-phase fluid.

32. A thin-film vapor deposition apparatus according to claim 28, wherein the thin film comprises a thin film of metal oxide, and the material gas comprises an organic metal gas and an oxygen-containing gas.

33. A thin-film vapor deposition apparatus according to claim 28, wherein said temperature control means further comprises:
- detecting means for detecting a temperature of an inner wall of said reaction chamber and a temperature of said shower head; and
- temperature adjusting means for adjusting a temperature of said heating medium flowing in said flow path systems disposed in said shower head and in said reaction casing, respectively, depending on a difference between said temperature detected by said detecting means and a target temperature.

34. A thin-film vapor deposition apparatus according to claim 33, wherein said adjusting means adjusts temperatures of said heating medium flowing in each of said at least two independent flow path systems to control said shower head and said reaction casing to be at temperatures different from each other.

35. A thin-film vapor deposition apparatus comprising:
- a reaction casing defining a reaction chamber;
- a stage for supporting a substrate, said stage being disposed in said reaction chamber;
- a shower head for discharging a material gas toward the substrate on said stage for depositing a thin film on the substrate;
- temperature control means, disposed in regions of said shower head and said reaction casing, for controlling temperatures of said reactions, said temperature control means comprising at least two independent flow path systems for passing said heating medium therethrough, said at least two independent flow path systems being disposed in said shower head and said reaction casing, respectively; and
- said reaction casing comprising an inner wall, an outer wall, a plurality of ribs projecting from said inner wall and held against said outer wall, and said flow path system of said reaction casing for passing said heating medium therethrough being defined by said ribs between said inner wall and said outer wall.

36. A thin-film vapor deposition apparatus according to claim 35, wherein said temperature control means further comprises:
- a detecting means for detecting a temperature of an inner wall of said reaction chamber; and
- flow rate regulating means for regulating a rate of flow of said heating medium flowing in each of said flow path systems disposed in said shower head and said reaction casing, respectively, depending on a difference between said temperature detected by said detecting means and a target temperature.

37. A thin-film vapor deposition apparatus according to claim 35, wherein said shower head comprises a vertical cylindrical portion and a nozzle portion, each of said vertical cylindrical portion and said nozzle portion having at least one of said flow path systems.

38. A thin-film vapor deposition apparatus according to claim 35, wherein said heating medium comprises a fluorine-base liquid-phase fluid.

39. A thin-film vapor deposition apparatus according to claim 35, wherein the thin film comprises a thin film of metal oxide, and the material gas comprises an organic metal gas and an oxygen-containing gas.

40. A thin-film vapor deposition apparatus according to claim 35, wherein said temperature control means further comprises:
- detecting means for detecting a temperature of an inner wall of said reaction chamber and a temperature of said shower head; and
- temperature adjusting means for adjusting a temperature of said heating medium flowing in said flow path systems disposed in said shower head and in said reaction casing, respectively, depending on a difference between said temperature detected by said detecting means and a target temperature.

41. A thin-film vapor deposition apparatus according to claim 40, wherein said adjusting means adjusts temperatures of said heating medium flowing in each of said at least two independent flow path systems to control said shower head and said reaction casing to be at temperatures different from each other.

42. A thin-film vapor deposition apparatus comprising:
- a reaction casing defining a reaction chamber;
- a stage for supporting a substrate, said stage being disposed in said reaction chamber;
- a shower head for discharging a material gas toward the substrate on said stage for depositing a thin film on the substrate;
- temperature control means, disposed in regions of said shower head and said reaction casing, for controlling temperatures of said reactions, said temperature control means comprising at least two independent flow path systems for passing said heating medium therethrough, said at least two independent flow path systems being disposed in said shower head and said reaction casing, respectively; and
- said reaction casing comprising a casing member of an inverted pot shape connected to said shower head and a support base disposed near said stage and spaced from said stage, each of said casing member and said support base having at least one of said flow path systems.

43. A thin-film vapor deposition apparatus according to claim 42, wherein said temperature control means further comprises:
- a detecting means for detecting a temperature of an inner wall of said reaction chamber; and
- flow rate regulating means for regulating a rate of flow of said heating medium flowing in each of said flow path systems disposed in said shower head and said reaction casing, respectively, depending on a difference between said temperature detected by said detecting means and a target temperature.

44. A thin-film vapor deposition apparatus according to claim 42, wherein said shower head comprises a vertical cylindrical portion and a nozzle portion, each of said vertical cylindrical portion and said nozzle portion having at least one of said flow path systems.

45. A thin-film vapor deposition apparatus according to claim 42, wherein said reaction casing further comprises a shield plate disposed between said stage and said support base.

46. A thin-film vapor deposition apparatus according to claim 42, wherein said heating medium comprises a fluorine-base liquid-phase fluid.

47. A thin-film vapor deposition apparatus according to claim 42, wherein the thin film comprises a thin film of metal oxide, and the material gas comprises an organic metal gas and an oxygen-containing gas.

48. A thin-film vapor deposition apparatus according to claim 42, wherein said temperature control means further comprises:

detecting means for detecting a temperature of an inner wall of said reaction chamber and a temperature of said shower head; and temperature adjusting means for adjusting a temperature of said heating medium flowing in said flow path systems disposed in said shower head and in said reaction casing, respectively, depending on a difference between said temperature detected by said detecting means and a target temperature.

49. A thin-film vapor deposition apparatus according to claim 48, wherein said adjusting means adjusts temperatures of said heating medium flowing in each of said at least two independent flow path systems to control said shower head and said reaction casing to be at temperatures different from each other.

* * * * *